United States Patent
Kubo et al.

(10) Patent No.: US 7,898,262 B2
(45) Date of Patent: Mar. 1, 2011

(54) CONTROL APPARATUS AND METHOD FOR VEHICLE EQUIPPED POWER SUPPLY HAVING BATTERY DETERIORATION DIAGNOSTIC FEATURE

(75) Inventors: Asami Kubo, Yokohama (JP); Sadafumi Ikeda, Kanagawa (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 1487 days.

(21) Appl. No.: 10/953,364

(22) Filed: Sep. 30, 2004

(65) Prior Publication Data

US 2005/0088148 A1    Apr. 28, 2005

(30) Foreign Application Priority Data

Oct. 23, 2003    (JP) .............................. 2003-362774

(51) Int. Cl.
*G01N 27/416* (2006.01)
(52) U.S. Cl. ....................... 324/427; 320/104
(58) Field of Classification Search ................. 320/104, 320/134; 324/427
See application file for complete search history.

(56) References Cited

U.S. PATENT DOCUMENTS

| | | | | |
|---|---|---|---|---|
| 5,122,723 A | * | 6/1992 | Sato | 320/123 |
| 5,287,286 A | * | 2/1994 | Ninomiya | 702/63 |
| 5,703,486 A | * | 12/1997 | Arai et al. | 324/427 |
| 6,268,712 B1 | | 7/2001 | Laig-Hörstebrock et al. | |
| 6,534,992 B2 | * | 3/2003 | Meissner et al. | 324/426 |
| 6,583,599 B1 | * | 6/2003 | Phillips et al. | 320/104 |
| 6,659,213 B2 | | 12/2003 | Kubo et al. | |
| 6,696,842 B2 | | 2/2004 | Traub | |
| 2002/0030494 A1 | * | 3/2002 | Araki et al. | 324/427 |
| 2002/0101217 A1 | * | 8/2002 | Hosoda et al. | 320/124 |
| 2004/0176904 A1 | * | 9/2004 | Toyoshtima et al. | 701/113 |

FOREIGN PATENT DOCUMENTS

| | | |
|---|---|---|
| DE | 39 01 680 A1 | 3/1990 |
| DE | 43 41 826 A1 | 6/1994 |
| DE | 198 31 723 A1 | 1/2000 |
| JP | 59-193371 A | 11/1984 |
| JP | 7-63114 A | 3/1995 |
| JP | 2001-163129 A | 6/2001 |
| JP | 2001-268708 A | 9/2001 |
| JP | 2003-127807 A | 5/2003 |
| WO | WO 02/08777 A1 | 1/2002 |

\* cited by examiner

*Primary Examiner*—Edward Tso
*Assistant Examiner*—Samuel Berhanu
(74) *Attorney, Agent, or Firm*—Foley & Lardner LLP

(57) ABSTRACT

In control apparatus and method for a power supply equipped in an automotive vehicle, the vehicle includes an engine, a starter to start the engine, a battery to reserve the electrical power supplied to the starter, and a generator driven by means of the engine to generate the electrical power to charge the battery, a terminal voltage of the battery is detected in a form of a battery voltage, a charge current flowing into the battery by means of the generator is detected, and a degree of deterioration of the battery is determined on the basis of at least one of the battery voltage detected after the power supply is turned on and before a start of operation of the generator and the charge current detected after the start of operation of the generator.

18 Claims, 8 Drawing Sheets

CONTROL APPARATUS AND METHOD FOR VEHICLE EQUIPPED POWER SUPPLY HAVING BATTERY DETERIORATION DIAGNOSTIC FEATURE

BACKGROUND OF THE INVENTION

1. Field of the Invention

The present invention relates to control apparatus and method for vehicle equipped power supply and particularly relates to a technique to diagnose a deterioration of a vehicular battery with a high accuracy although an inexpensive structure.

2. Description of the Related Art

In general, a battery is mounted in a vehicle as a power supply for a starter to perform a cranking and other electrical parts. The battery is chargeable or dischargeable and it is usual practice that an output voltage level (a charged state of the battery) is controlled to a predetermined level by controlling a generated power of an alternator in accordance with an actual charged state of the battery and in accordance with a driving state of an engine. In addition, in a hybrid vehicle in which an electric motor is disposed as a drive source except the engine, this electric motor is used as the starter to enable the cranking. A Japanese Patent Application First Publication No. 2001-268708 published on Sep. 28, 2001 (which corresponds to a U.S. Pat. No. 6,659,213 issued on Dec. 9, 2003) exemplifies a previously proposed diagnostic apparatus for diagnosing the deterioration of the vehicle mounted battery. With a connection between the battery and the electrical load therefore interrupted, a terminal voltage of the battery is detected as an electromotive force E0, during the large current discharge state along with the cranking the terminal voltage across the battery is detected as V0 and a discharge current thereat is detected as I. On the basis of the detected, E0, V, and I, an internal resistance R of battery is calculated in accordance with the following equation (1), and a magnitude of the calculated R is deemed to be the degree of deterioration of the battery.

$$R = (E0 - V)/I \qquad (1).$$

SUMMARY OF THE INVENTION

However, the following problem occurs in the diagnostic apparatus disclosed in the above-described Japanese Patent Application First Publication. That is to say, it is necessary to previously detect the electromotive force E0 when the degree of the deterioration of the battery (namely, the internal resistance) is calculated. However, in a generally available vehicle, such a structure that terminals of the battery can be open is not adopted so that it is impossible to detect electromotive force E0. If electromotive force E0 is tried to be detected, it is necessary to adopt a special structure for detecting electromotive force E0. Thus, the structure becomes complex and the cost is increased. In addition, in the above-described previously proposed diagnostic apparatus, it is necessary to detect an electric characteristic of the battery during the cranking, particularly, a discharge current with a high accuracy. At this time, an expensive current sensor is needed. This provides a cause of an increase in the cost.

It is, therefore, an object of the present invention to provide control apparatus and method for a vehicle equipped power supply with a diagnostic feature for a deterioration of the battery which are capable of adopting a relatively inexpensive current sensor together with an unnecessary detection of the battery electromotive force and diagnosing the deterioration of the battery although it is inexpensive structure.

According to one aspect of the present invention, there is provided with a control apparatus for a power supply equipped in an automotive vehicle, the vehicle including an engine, a starter to start the engine, a battery to reserve the electrical power supplied to the starter, and a generator driven by means of the engine to generate the electrical power to charge the battery, the control apparatus comprising: a battery voltage detecting section that detects a terminal voltage of the battery in a form of a battery voltage; a charge current detecting section that detects a charge current flowing into the battery by means of the generator; and a deterioration determining section that determines a degree of deterioration of the battery on the basis of at least one of the battery voltage detected after the power supply is turned on and before a start of operation of the generator and the charge current detected after the start of operation of the generator.

According to another aspect of the present invention, there is provided with a control method for a power supply equipped in an automotive vehicle, the vehicle including an engine, a starter to start the engine, a battery to reserve the electrical power supplied to the starter, and a generator driven by means of the engine to generate the electrical power to charge the battery, the control apparatus comprising: detecting a terminal voltage of the battery in a form of a battery voltage; detecting a charge current flowing into the battery by means of the generator; and determining a degree of deterioration of the battery on the basis of at least one of the battery voltage detected after the power supply is turned on and before a start of operation of the generator and the charge current detected after the start of operation of the generator.

This summary of the invention does not necessarily describe all necessary features so that the invention may also be a sub-combination of these described features.

DETAILED DESCRIPTION OF THE PREFERRED EMBODIMENTS

Reference will hereinafter be made to the drawings in order to facilitate a better understanding of the present invention.

Figure 1:
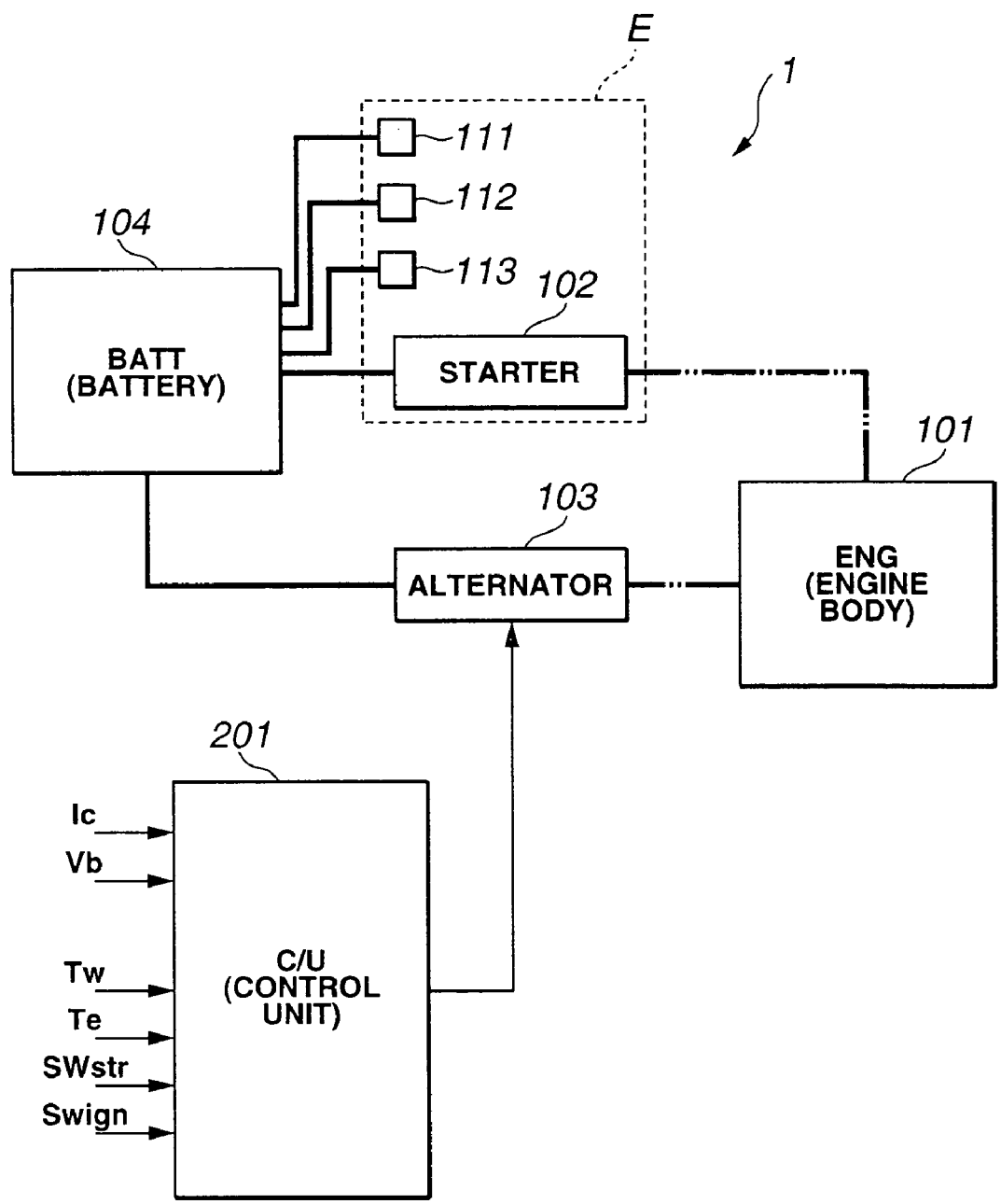
FIG. 1 is a block diagram of a control apparatus for a vehicle equipped power supply in a preferred embodiment according to the present invention.
Figure 2:
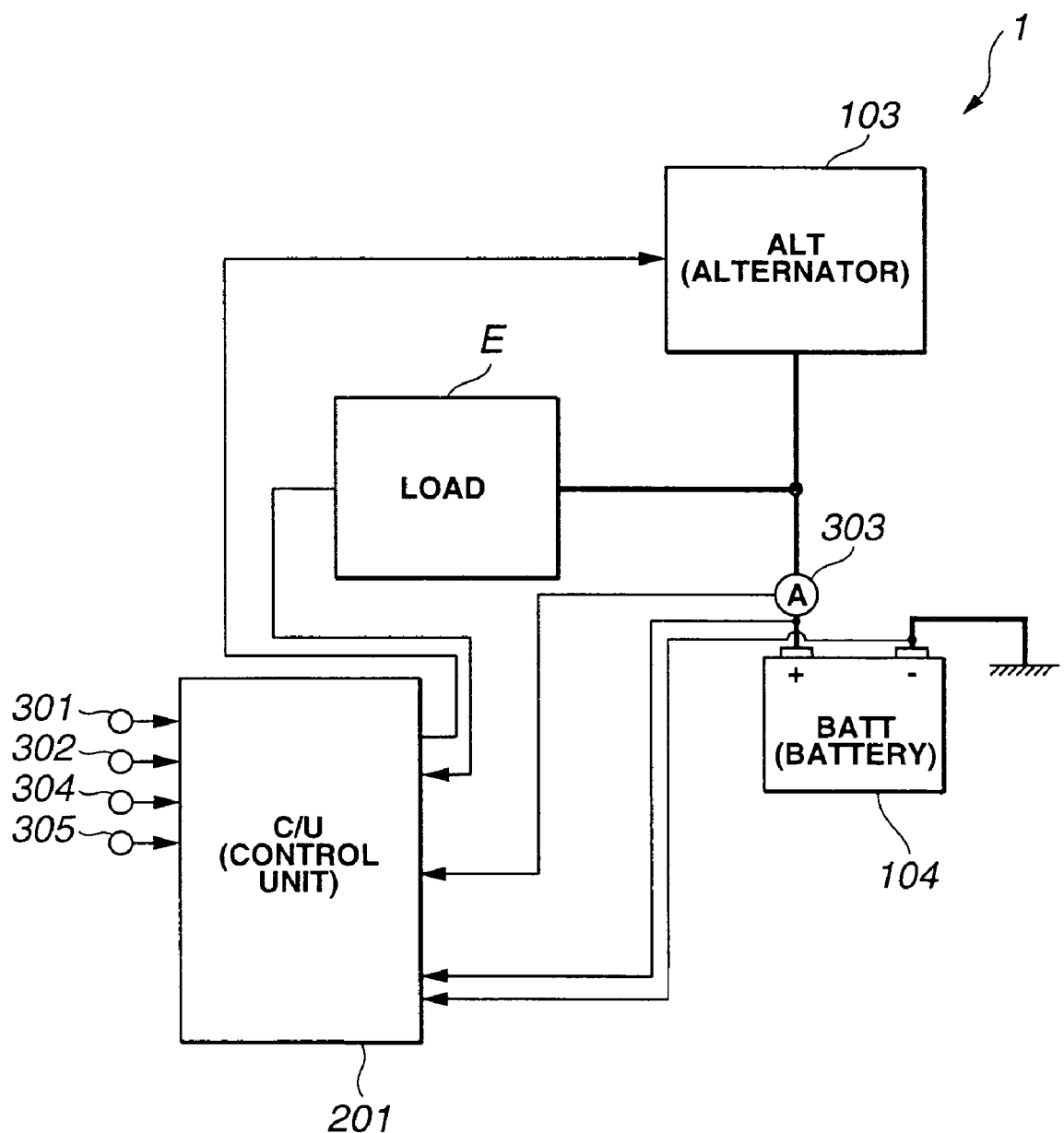
FIG. 2 is a configuration of the control apparatus for the vehicle equipped power supply in the preferred embodiment shown in FIG. 1.

FIGS. 1 and 2 show a structure of a vehicle equipped power supply (or simple referred to as a power supply) in a preferred embodiment of a vehicular power supply control apparatus according to the present invention. Power supply 1 is constituted by power supply for various kinds of electrical parts 102 and 111 through 113 equipped in the vehicle. An engine (engine body) 101 constitutes a drive source of this automotive vehicle. In engine 1, a starter 102 installed as a starting motor to perform an engine cranking during a start of engine 101. In addition, an alternator 103 is installed in engine 1 as a generator operated with a power of engine 1. Alternator 103 is operated in response to a command signal from a control unit 201 (hereinafter, referred to as C/U) and generates an electric power in accordance with the command signal. A battery 104 (BATT) is chargeable and dischargeable and reserves the power generated by alternator 104. The generated power of alternator 103 and discharge power of battery 104 are supplied to starter 102 and other electrical parts 111 through 113. The other electrical parts include head lamps 111, a blower 112 of a vehicular air conditioner, and a defogger 113.

Control unit 201 receives a detection signal of a coolant temperature sensor 301 detecting a coolant temperature Tw of engine 1 and electrolyte temperature sensor 302 to detect an electrolyte temperature Te of battery 104, and a detection signal of a current sensor 303 to detect a charge-and-discharge current Ic of battery 104 (refer to FIG. 2). Control unit 201 is connected to battery 104 and has a function to detect a terminal voltage (namely, the battery voltage) Vb of battery 104. In addition, control unit 201 receives a start switch signal SWstr from a start switch 304 and an ignition switch signal SWign from an ignition switch 305. Control unit 201 controls a generation operation of alternator 103 on the basis of the received detection signals. That is to say, control unit (C/U) 201 detects a charged state SOC (State Of Charge) of battery 104, controls the generated power of alternator 103 in accordance with the detected SOC, and supplies the generated power of alternator 103 and the discharge power of battery 104 to the electrical parts 102 and 111 through 113. In addition, control unit 201 charges the generated power of alternator 103 into battery 104 and controls the charged state of battery 104 to a predetermined level.

Figure 3:
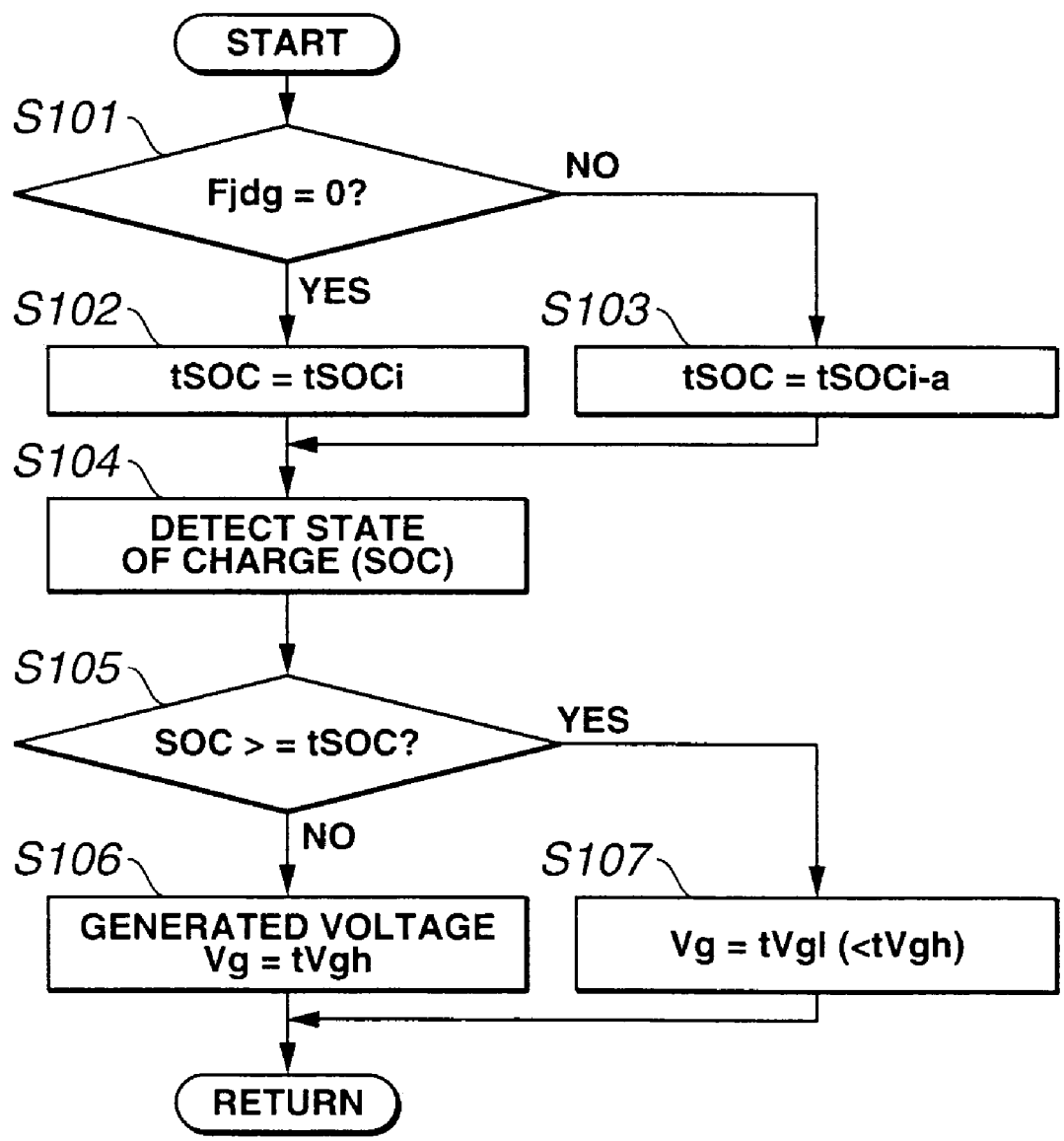
FIG. 3 is a flowchart of a power generation control procedure in the control apparatus shown in FIG. 2.

Hereinafter, an operation of control unit 201 will be described below with reference to a flowchart. In this embodiment, control unit 201 varies the generated power of alternator 103 in accordance with the charged state of battery 104, diagnoses a deterioration of battery 104, and varies the generated power of alternator 103 in accordance with the charged state of battery 104. FIG. 3 shows a flowchart of a power generation control routine. This routine is executed for each of predetermined times after the ignition switch is turned on.

That is to say, at a step S101, control unit 201 determines whether a deterioration determination (judgment) flag Fjdg is 0 or not. If this flag indicates 0 (yes), the routine goes to a step S102. If this flag indicates not 0 at step S101, the routine goes to a step S103. This deterioration determination flag Fjdg is ordinarily set to 0. However, as will be described later, when control unit 201 determines that the deterioration degree of battery 104 has reached to a predetermined level, this flag Fjdg is set to "1". At step S102, control unit 201 sets target level tSOC of the charged state of battery 104 to a predetermined value tSOCi.

At step S103, a target level tSOC of the charged state of battery 104 is set to a value which is a subtraction of a predetermined value a from tSOC. The deterioration of battery 104 is advanced. At this time, since the charge capacity of battery 104 is reduced, target level tSOC is reduced by the reduction in the charge capacity so as to prevent an excessive charge. At step S104, control unit 201 detects the charged state (SOC: State Of Charge) of battery 104. The charged state (SOC) is an accumulation of the charge-and-discharge current Ic of battery 104 (during the charge, this value is positive and, during the discharge, this value is negative) and approximated to the calculated accumulated value of ΣIc.

At a step S105, control unit 201 determines whether the detected SOC has reached to target level tSOC. If control unit 201 determines that the detected SOC has reached to target level tSOC, the routine goes to a step S107. If not reached (No) at step S105, the routine goes to a step S106. At step S106, control unit 201 determines that the charged state of battery 104 has not reached to target level tSOC and it is necessary to charge and sets a generated voltage Vg of alternator 103 is a relatively large predetermined value of tVgh.

At step S107, the charged state of battery 104 has reached to a target level tSOC. Hence, generated voltage Vg of alternator 103 is set to a predetermined value tvgl smaller than tvgh and supplies the discharge power of battery 104 mainly to the power of electrical parts 102, 111 through 113. It is noted that predetermined values of tvgh and tVgl is increased or decreased in accordance with a magnitude of an electrical load (in accordance with an operating state of any one or more of the electrical parts).

Figure 4:
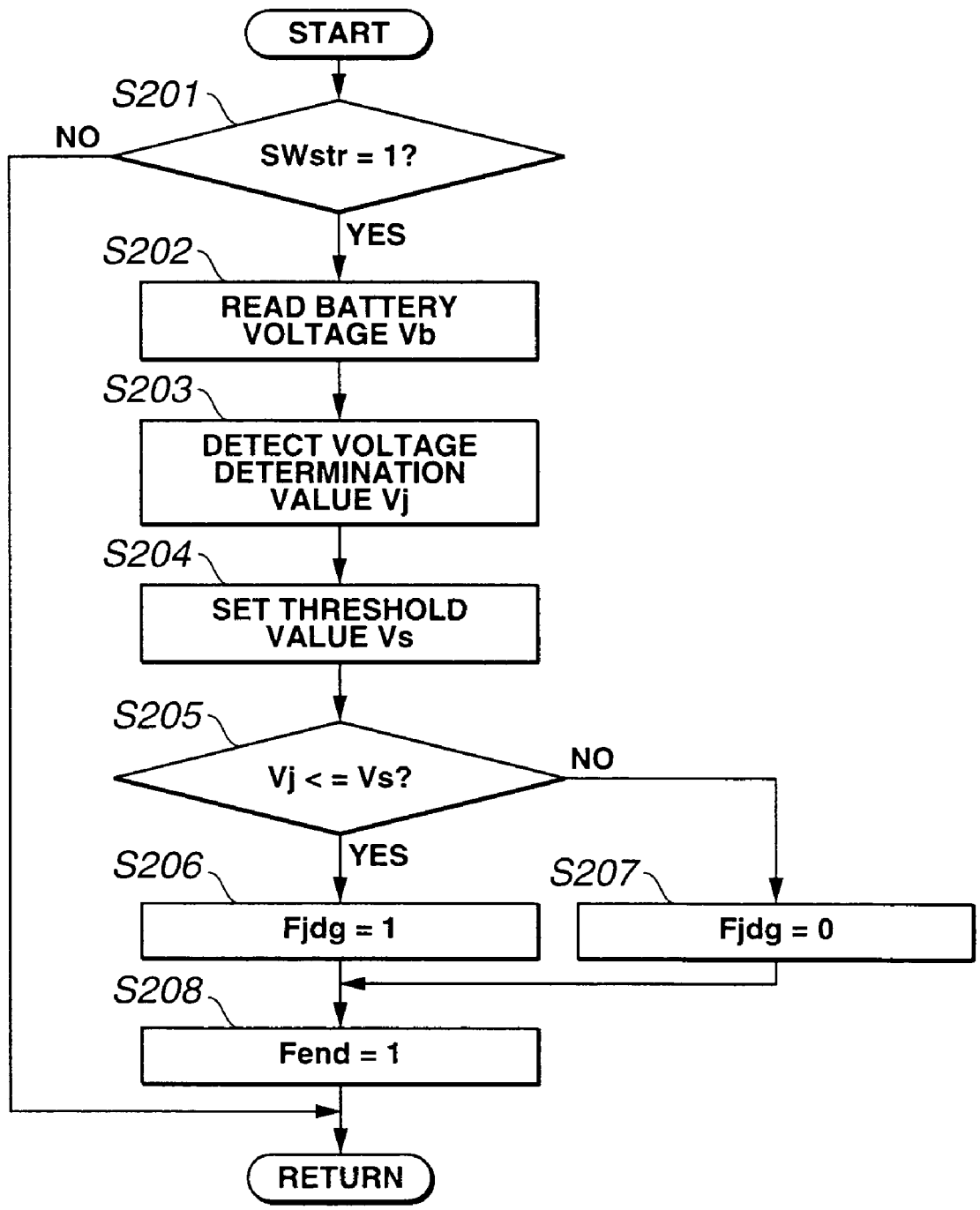
FIG. 4 is a flowchart of a deterioration diagnostic routine executed by the control apparatus shown in FIG. 2.
Figure 7:
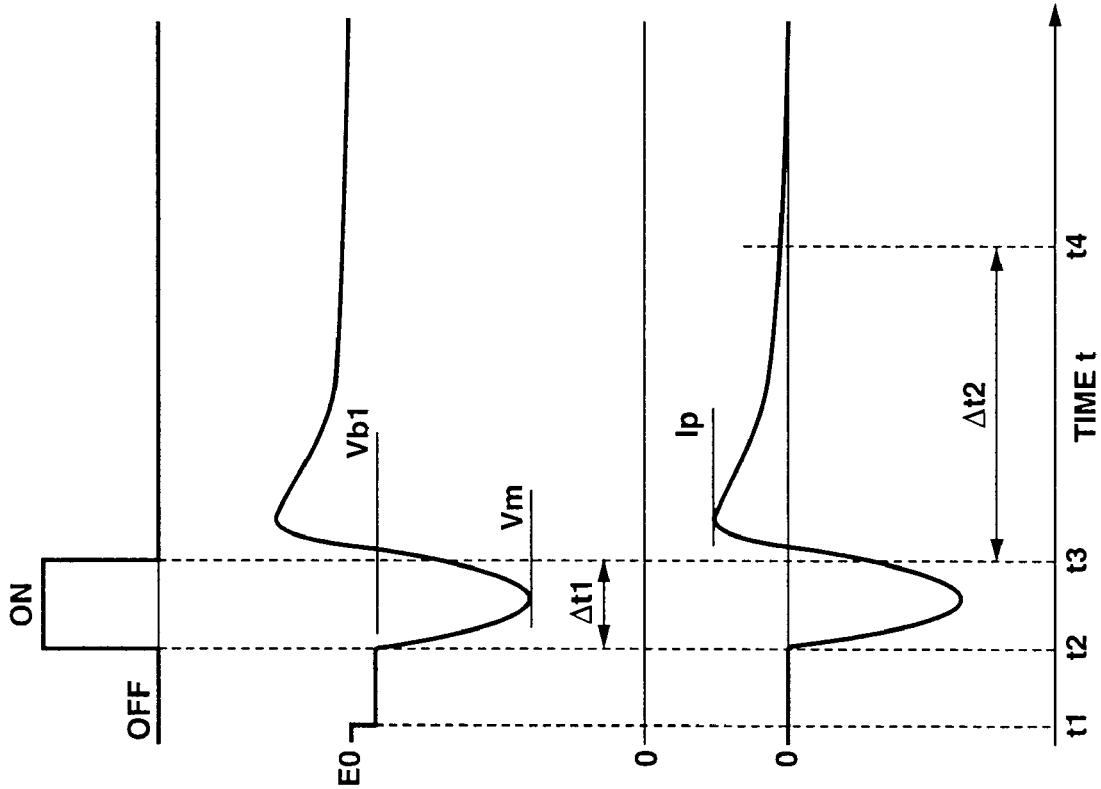
FIGS. 7A, 7B, and 7C integrally show a timing chart representing a battery voltage Vs and charge-discharge current Ic.

FIG. 4 is a flowchart of a deterioration diagnosis routine. This routine is executed for each of the predetermined times after the ignition switch is turned on. At a step S201, control unit 201 determines whether starter switch signal SWstr is turned to "1". If it is turned to "1", start switch is turned on and the routine goes to a step S202. If not turned to "1", the present routine is ended. It is noted that, in this embodiment, as a simple method of determining whether it is the cranking time or after the cranking, the value of start switch signal SWstr is referred to. On the basis of engine speed Ne, control unit 201 determines whether a complete burning is ended and, according to the result of this determination, control unit 201 may determine whether it is during the cranking. At step S202, control unit 201 reads battery voltage Vb. At a step S203, control unit 201 detects the voltage determination value Vj. For the voltage determination value Vj, the explanation is made with reference to FIGS. 7A through 7C. FIGS. 7A through 7C show variations in the battery voltage Vb and charge-and-discharge current Ic during the start of engine 1.

Battery voltage Vb is reduced (time t1), first, when ignition switch is turned on. The discharge power of battery 104 is consumed as the electrical power of various kinds of control units including control unit 201. When the start switch is turned on, the cranking is started (time t2) by means of a starter 102. The large current discharge occurs from battery 104 is generated so that battery voltage Vb is greatly reduced. Along with the complete burning of engine 1, alternator 103 starts the generation upon receipt of the charged state (SOC) of battery due to the large current discharge. The generated power of alternator 103 is supplied to the charge of battery 104. The charge-and-discharge current Ic, thereafter, peaks and is decreased due to the recovery of the charged state SOC.

Figure 5:
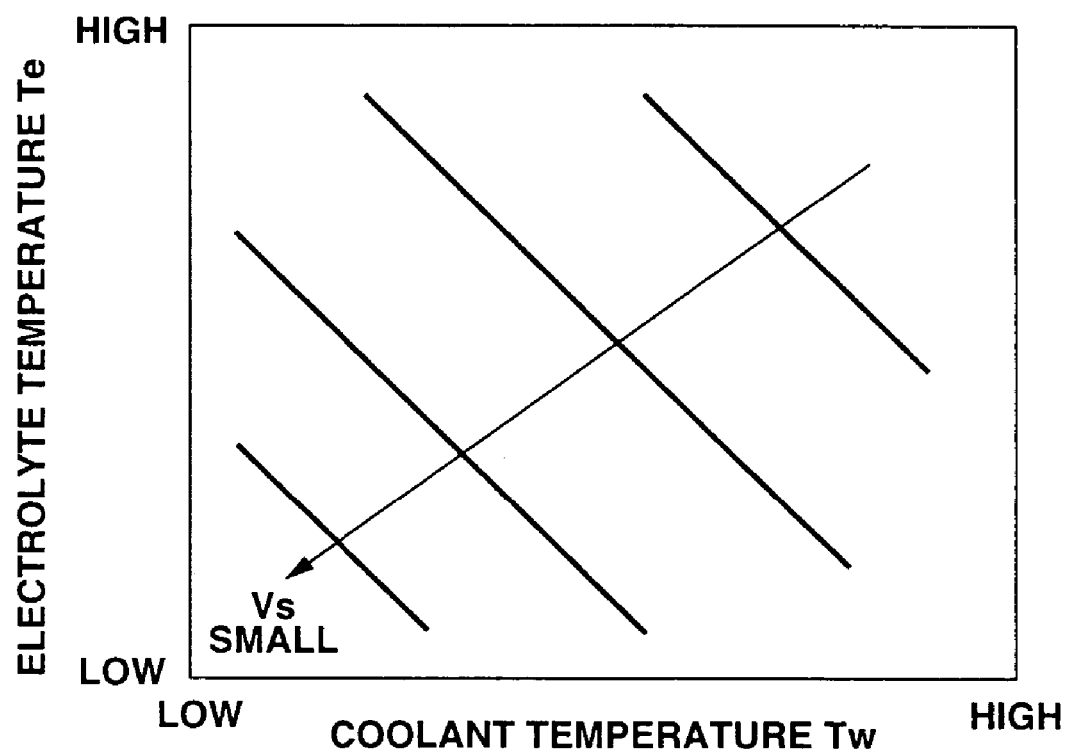
FIG. 5 is a map view representing a threshold voltage Vs.

In this embodiment, as a voltage determination value Vj, a minimal value of battery voltage Vb during the cranking (hereinafter, referred to as a voltage minimal value) is adopted as voltage determination value Vj. At a step S204, control unit 201 sets threshold value Vs. Threshold value Vs searches a map (shown in FIG. 5) to which Vs is allocated in accordance with coolant temperature Tw and electrolyte temperature Te. As Tw is low and Te is low, Vs is set to a smaller value. During the low coolant temperature, a slide friction within engine 1 is large. As compared with the high coolant temperature, the reduction in battery voltage Vb due to the cranking is large. In addition, during the low temperature electrolyte temperature, the internal resistance of battery 104 is large and, as compared with the high electrolyte temperature, the output itself of battery 104 is small.

At step 205, control unit 201 determines whether the detected Vj is equal to or below the set Vs. If Vj is equal to or low than Vs (Yes) at step S205, the routine goes to a step S206. If Vj>Vs (No) at step S205, the routine goes to a step S207. As a characteristic of battery voltage Vb, as the deterioration becomes advanced, the reduction in the battery voltage 104 due to the large current discharge becomes large. Hence, when voltage minimal value Vm is equal to or below threshold value Vs, control unit 201 can determine that the deterioration degree of battery 104 has reached to a predetermined level.

At step S206, deterioration determination flag Fjdg is set to "1". At step S207, deterioration determination flag Fjdg is reset to "0". At a step S208, end determination flag Fend is set to "1". It is noted that end determination flag Fend is switched to 0 when the final determination on the deterioration is made at the subsequent diagnosis ascertaining routine.

It is noted that, in this embodiment, voltage minimal value Vm during the cranking is adopted as voltage determination value Vj. In place of this, battery voltage Vb is accumulated during the cranking (simply, while the start switch is turned on) and the calculated accumulation value of ΣV or an average value AVEv (=ΣV/Δt1) of battery voltage Vb may be adopted. The calculated ΣV or average value AVEv is compared with the corresponding threshold value. If either ΣV or AVEv is equal to or below the threshold value, control unit 201 determines that the deterioration degree has reached to a predetermined level.

Figure 6:
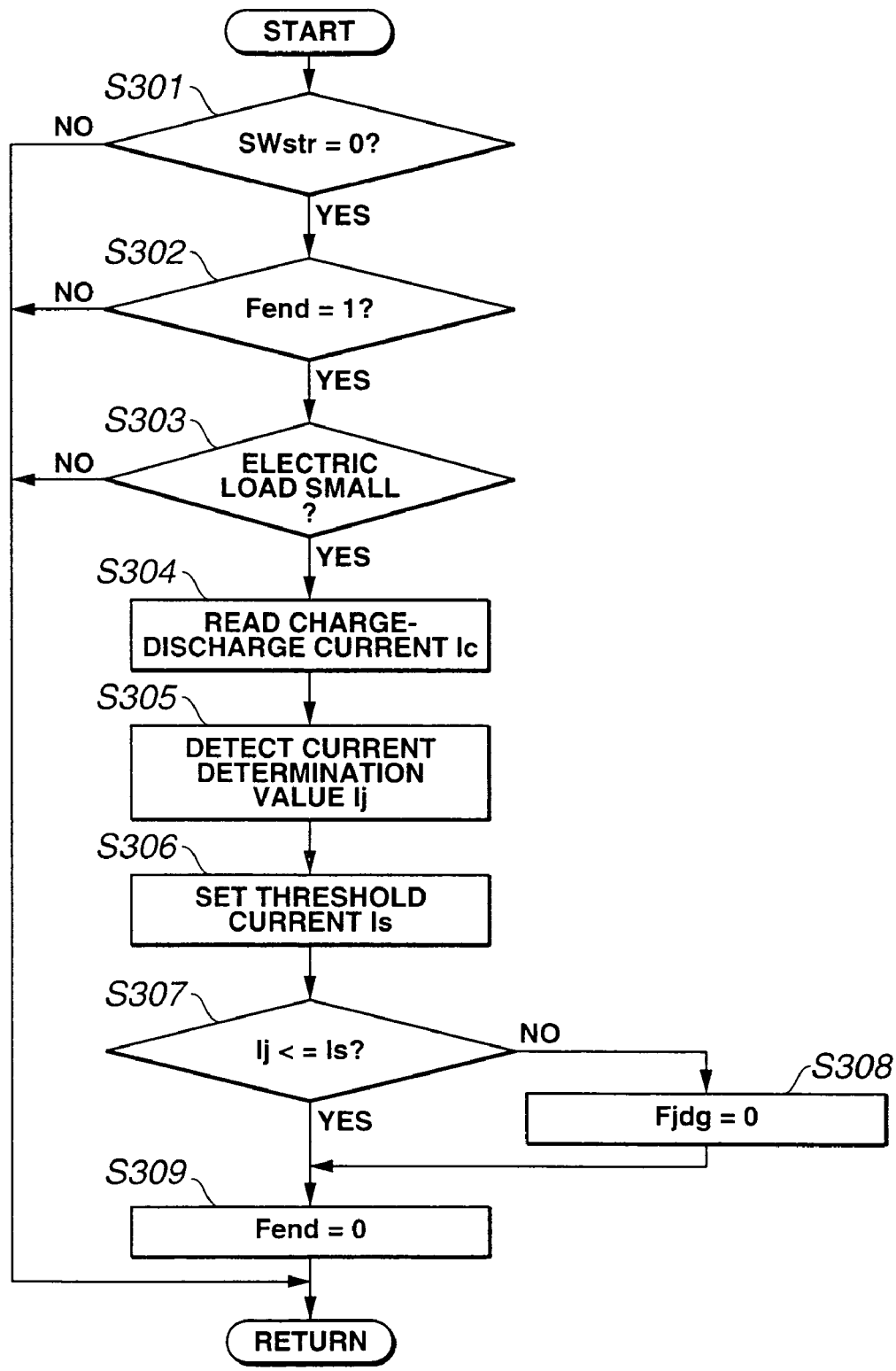
FIG. 6 is a flowchart of a diagnostic ascertained routine executed by the control apparatus shown in FIG. 2.

FIG. 6 shows a flowchart of the diagnosis ascertaining routine. This routine is executed from each of the predetermined times after the ignition switch is turned on. At a step S301, control unit 201 determines whether start switch signal SWstr is at a "0". If "0" (Yes) at step S301, the routine goes to a step S202. If not "0" (No) at step S301, the routine is ended. At step S302, control unit 201 determines if end determination flag Fend is at a "1". If this flag state is at "1", control unit 201 determines that the determination of the deterioration is ended at the deterioration diagnosis routine and the cranking is ended and the routine goes to a step S303. If not "1", this routine is ended.

At step S303, control unit 201 detects the operation state of the electrical parts (namely, a magnitude of the electrical load) and determines if the detected magnitude of the electrical load is smaller than a predetermined value. If the magnitude of the electrical load is smaller than the predetermined value (yes) at step S303, the routine goes to a step S304. If the magnitude thereof is equal to or larger than the predetermined value (No) at step S303, this routine is ended. When the magnitude of the electrical load is large, a cause of the reduction in battery voltage Vb during the cranking includes the electrical load other than that due to the cranking. There is a possibility that the determination takes the error.

At step S304, control unit 201 reads the charge-discharge current Ic. At a step S305, control unit 201 detects current determination value Ij. In this embodiment, a maximal value Ip of a charge-and-discharge current Ic after the cranking is adopted as the current determination value Ij (refer to FIGS. 7A through 7C). At the next step S306, control unit 201 sets a threshold current Is. This threshold current Is may be a constant.

At a step S307, control unit 307 determines if the detected Ij is equal to or below set Is. If Ij is equal to or below set Is (Yes), the routine goes to a step S309. If Ij is larger than Is (No), the routine goes to a step S308. In a state in which the deterioration of battery 104 is advanced, the internal resistance of battery 104 is augmented. Hence, the charge-and-discharge current (specifically, charge current) Ic when the generated power of alternator 103 is constant is made small. Therefore, if current determination value Ij (namely, current maximal value Ip) is equal to or below threshold current Is, control unit 201 can determine that the large reduction of battery voltage Vb during the cranking is caused by the deterioration of battery 104 under a sufficient reliability. On the other hand, even in a state where the deterioration of battery 104 is not so advanced, electromotive force E0 is reduced when the charged state (SOC) of battery 104 is low. Hence, voltage determination value Ij such as voltage minimal value Vm is reduced so that the deterioration is determined to occur (refer to step S206). When the charged state SOC of battery is low, the charge-and-discharge current Ic after the start of the power generation is increased as compared with the high charged state. Hence, if control unit determines that current determination value Vj is larger than threshold current Is, an erroneous determination of the deterioration due to the reduction of the charged state SOC can be prevented.

At step S308, control unit 201 sets deterioration determination flag FJdg to "0". At step S309, control unit 201 sets end determination flag Fend to "0". It is noted that, in this embodiment, current maximal value Ip after the cranking is adopted as current determination value Ij. In place of this, charge-and-discharge current Ic over a predetermined interval of time (simply, a predetermined interval of time from a time at which the start switch is turned off) Δt2 after the cranking may be accumulated and the calculated accumulation value ΣI or an average value AVEi (=ΣI/Δt2) of charge-and-discharge current may be adopted as current determination value Ij. The calculated ΣI or AVEi is compared with their respective threshold values. If either ΣI or AVEi is larger than the corresponding threshold value, control unit 201 may set deterioration determination flag Fjdg to 0 (step S308).

In this embodiment, step S202 in the flowchart of FIG. 2 constitutes battery voltage detecting means (section), step S304 in the flowchart shown in FIG. 6 constitutes charged current detecting means (section), the whole flowcharts shown in FIGS. 4 and 6 (except steps S202, S303, and S304) constitute deterioration determining means (section), step S303 in the flowchart shown in FIG. 6 constitutes determination inhibiting means (section), step S104 in the flowchart shown in FIG. 3 constitutes charge state detecting means (section), and all steps except step S104 constitutes charged state controlling means (section).

The following advantages can be obtained in the above-described embodiment. That is to say, on the basis of battery voltage Vb and charge-and-discharge current Ic, voltage determination value Vj and current determination value Ij are detected, the deterioration of battery 104 is diagnosed according to the detected Vj and Ij. Therefore, it is not necessary to detect electromotive force E0 of battery 104. In addition, an inexpensive sensor 303 can detect charge-and-discharge current Ic. Although it is inexpensive sensor, the deterioration of battery 104 can be diagnosed with a high accuracy.

In addition, in this embodiment, the result of diagnosis carried out with a high accuracy is reflected on a control of the charged state of battery 104. When the deterioration of battery 104 is advanced, target level tSOC in the charged state is set to be lowered. Hence, an excessive charge can be prevented and a wasteful power generation by means of alternator 103 can be avoided, and a fuel consumption of engine 1 can be saved.

Figure 8:
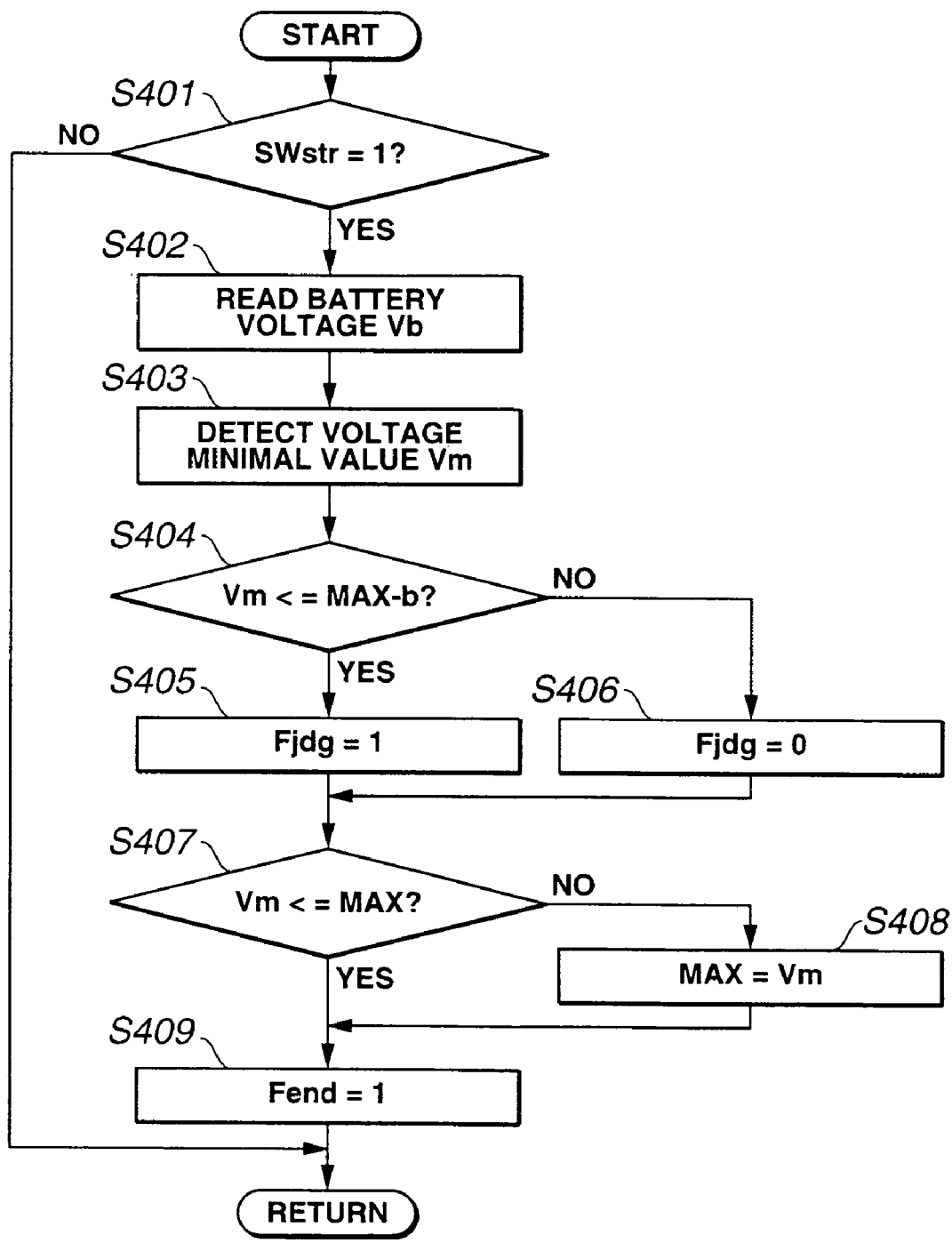
FIG. 8 is a flowchart representing another diagnostic routine in another preferred embodiment of the control apparatus according to the present invention.

FIG. 8 shows a flowchart of the deterioration determination routine in another preferred embodiment of the control apparatus according to the present invention.

This routine is executed for each of the predetermined times after the ignition switch is turned on. At a step S401, control unit 201 determines whether start switch signal Swstr is turned to "1". If SWstr is at a "1" (Yes), the routine goes to a step S402. If SWstr is not at a "1" (No), the routine is ended. At step S402, control unit 201 reads battery voltage Vb. At a step S403, control unit 201 detects the minimal value of battery voltage Vb during the cranking, namely, voltage minimal value Vm.

At a step S404, control unit 201 reads a voltage stored value MAX and determines whether the detected Vm is equal to or below a value (=MAX−b) of a subtraction of a predetermined value b from read MAX. If Vm≦MAX−b at step S404, the routine goes to a step S405. If Vm>MAX−b at step S404, the routine goes to a step S406. Voltage stored value MAX is a maximum value of voltage minimal value Vb detected at step S403 until the previous routine and is held within a memory of control unit 201. Predetermined value b has a reversed characteristic to the above-described threshold value Vs such that, as coolant temperature Tw becomes high and electrolyte temperature Te becomes high, predetermined value b is set to become small so that a subtraction value of MAX−b has the same characteristic as threshold value Vs.

At step S405, control unit 201 sets deterioration determination flag Fjdg to "1". At step S406, control unit 201 resets deterioration determination flag Fjdg to "0". At the next step S407, control unit 201 determines if presently detected Vm is equal to or below read MAX. If Vm≦MAX (Yes) at step S407, the routine goes to a step S409. If Vm>MAX (No) at step S407, the routine goes to a step S408. At step S408, control unit 201 updates memory held MAX to presently detected Vm (MAX=Vm).

At step S409, control unit 201 sets end determination flag Fend to "1" and the deterioration diagnosis at this routine is ended. It is noted that the diagnosis ascertaining routine may be the same as FIG. 6. In this embodiment, step S402 of the flowchart shown in FIG. 8 constitutes battery voltage detecting means (section) and the whole flowchart (except steps S402, S303, and S304) shown in FIGS. 8 and 6 constitute deterioration determining means (section).

According to the other embodiment, in addition to the advantages described in the previous embodiment, the following advantage can be obtained. That is to say, in the other embodiment, the maximum value of voltage minimal value Vm detected until the previously detected is held as voltage stored value MAX, the presently detected voltage minimal value Vm is compared with the voltage stored value MAX to diagnose the deterioration of battery 104. Threshold value Vs is difficult to be uniquely set according to an individual difference in the slide friction within engine 101, a capacity of battery 104, and characteristic of starter 102. It is necessary for threshold value Vs to be set to a value having a margin to some degree. However, since voltage stored value MAX is held and a learning function of threshold value (=MAX−b) is added, the setting of margin is unnecessary. Hence, the deterioration of battery 104 can accurately be diagnosed.

It is noted that a battery voltage Vb1 at a time point at which the ignition switch is turned on may be adopted in addition to voltage minimal value during the cranking as the voltage determination value Vj as appreciated from FIGS. 7A through 7C. If this battery voltage Vb1 is equal to or below the predetermined value, control unit determines that the deterioration degree of battery 104 has reached to the predetermined level. Then, as described above, a case where alternator 103 is adopted as the generator has been described. In a hybrid vehicle, an electric motor having a rotational axle linked to an engine crankshaft may be adopted as the generator. This electric motor may be used as the starter of engine 101. It is noted that a meaning that the degree of the deterioration of the battery has reached to a predetermined level is the same that the battery requires an appropriate charge.

The entire contents of a Japanese Patent Application No. 2003-362774 (filed in Japan on Oct. 23, 2003) are herein incorporated by reference. The scope of the invention is defined with reference to the following claims.

What is claimed is:

1. A control apparatus for a power supply equipped in an automotive vehicle, the vehicle including an engine, a starter to start the engine, a battery to reserve an electrical power supplied to the starter, and a generator driven by the engine to generate the electrical power to charge the battery, the control apparatus comprising:
    a battery voltage detecting section that detects a terminal voltage of the battery in a form of a battery voltage;
    a charge current detecting section that detects a charge current flowing into the battery from the generator; and
    a deterioration determining section configured to determine a degree of deterioration of the battery on the basis of a battery voltage detected after the power supply is turned on and before a start of operation of the generator and on the basis of a charge current detected after the start of operation of the generator.

2. A control apparatus for a power supply equipped in an automotive vehicle as claimed in claim 1, wherein the deterioration determining section is configured to determine the degree of deterioration of the battery on the basis of a battery voltage detected during an engine cranking and a charge current detected after the engine cranking.

3. A control apparatus for a power supply equipped in an automotive vehicle as claimed in claim 2, wherein the deterioration determining section is configured to determine that the degree of deterioration has reached a predetermined level when detecting a minimal value of the battery voltage during the engine cranking and when determining that the detected minimal value is equal to or lower than a predetermined value.

4. A control apparatus for a power supply equipped in an automotive vehicle as claimed in claim 2, wherein the deterioration determining section is configured to detect a minimal value of the battery voltage during the cranking, hold a maximum value of the minimal value of the battery voltage previously measured, and determine that the deterioration degree of the battery has reached a predetermined level when a difference between the held maximum value and a presently detected battery voltage is equal to or higher than a predetermined value.

5. A control apparatus for a power supply equipped in an automotive vehicle as claimed in claim 2, wherein the deterioration determining section is configured to determine that the degree of deterioration of the battery has reached a predetermined level when the battery voltage during the cranking is accumulated for a predetermined interval and a calculated accumulated value or an average value of the battery voltage is equal to or below a predetermined value.

6. A control apparatus for a power supply equipped in an automotive vehicle as claimed in claim 1, wherein the deterioration determining section is configured to determine that the degree of deterioration has reached a predetermined level when the battery voltage detected before an engine cranking after the power supply is turned is equal to or below a predetermined value.

7. A control apparatus for a power supply equipped in an automotive vehicle as claimed in claim 3, wherein the control apparatus further comprises a coolant temperature detecting section that is configured to detect a coolant temperature of an engine coolant, wherein the deterioration determining section is configured to modify the predetermined value in accordance with the detected coolant temperature.

8. A control apparatus for a power supply equipped in an automotive vehicle as claimed in claim 3, wherein the control apparatus further comprises an electrolyte temperature detecting section that is configured to detect a temperature of an electrolyte of the battery, wherein the deterioration determining section is configured to modify the predetermined value in accordance with the detected electrolyte temperature.

9. A control apparatus for a power supply equipped in an automotive vehicle as claimed in claim 2, wherein the deterioration determining section is configured to detect a maximal value of the charge current after the cranking and determines that the degree of deterioration has reached a predetermined level when the detected maximal value is equal to or lower than a predetermined value.

10. A control apparatus for a power supply equipped in an automotive vehicle as claimed in claim 2, wherein the deterioration determining section is configured to detect the charge current after the cranking, to accumulate the detected charge current over a predetermined interval, and to determine that the degree of deterioration of the battery has reached a predetermined level when a calculated accumulated value or an average value of the charge current is equal to or below a predetermined value.

11. A control apparatus for a power supply equipped in an automotive vehicle as claimed in claim 1, wherein the control apparatus is installed in the automotive vehicle, wherein the automotive vehicle includes electrical parts that do not include the starter, wherein the battery is the power supply, further comprising:
    a load detecting section that is configured to detect a load of the battery in accordance with operation states of the electrical parts, and
    a battery determination inhibiting section that is configured to inhibit the determination of the deterioration by the deterioration determining section when the detected load is equal to or higher than a predetermined value.

12. A control apparatus for a power supply equipped in an automotive vehicle as claimed in claim 1, wherein the control apparatus further comprises:
    a charged state detecting section that is configured to detect a charged-state of the battery; and
    a charge state control section that is configured to operate the generator by a generated power which accords with the detected charge state and is configured to control the charge state of the battery to a predetermined level, wherein the charge state control section is configured to vary the generated power in accordance with the degree of the deterioration of the battery.

13. A control apparatus for a power supply equipped in an automotive vehicle as claimed in claim 7, wherein, the predetermined value becomes smaller as the detected temperature of the coolant becomes lower.

14. A control apparatus for a power supply equipped in an automotive vehicle as claimed in claim 8, wherein, the predetermined value becomes smaller as the detected temperature of the electrolyte of the battery becomes lower.

15. A control apparatus for a power supply equipped in an automotive vehicle as claimed in claim 9, wherein the predetermined value is a constant value.

16. A control apparatus for a power supply equipped in an automotive vehicle as claimed in claim 5, wherein the predetermined value is varied in accordance with an engine coolant temperature and a battery electrolyte temperature.

17. A control apparatus for a power supply equipped in an automotive vehicle as claimed in claim 12, wherein a target state of charge in the battery when the deterioration determining section determines that the degree of deterioration of the battery has reached the predetermined level is smaller than that when the deterioration determining section determines that the degree of deterioration has not reached the predetermined level.

18. A control apparatus for a power supply equipped in an automotive vehicle as claimed in claim 17, wherein the control apparatus further comprises a state of charge determining section that determines whether the detected state of charge of the battery is equal to or larger than the target state of charge in the battery and wherein a generated voltage of the generator, when the state of charge determining section determines that the detected state of charge of the battery is equal to or larger than the target state of charge, is smaller than the generated voltage of the generator when the state of charge determining section determines that the detected state of charge of the battery is smaller than the target state of charge.

* * * * *